United States Patent [19]

Bakke et al.

[11] Patent Number: 5,094,624
[45] Date of Patent: Mar. 10, 1992

[54] METAL LATCH FOR SIMM SOCKET

[75] Inventors: Patrick D. Bakke, Naperville; Anthony M. DiViesti, Park Ridge; Kent E. Regnier, Lombard, all of Ill.; Masanori Yagi, Sagamihara; Shoji Yamada, Adachi, both of Japan; Alan Walse, LaGrange, Ill.

[73] Assignee: Molex Incorporated, Lisle, Ill.

[21] Appl. No.: 715,724

[22] Filed: Jun. 17, 1991

Related U.S. Application Data

[63] Continuation of Ser. No. 629,526, Dec. 18, 1990, abandoned, which is a continuation-in-part of Ser. No. 553,016, Jul. 16, 1990, abandoned.

[51] Int. Cl.⁵ .............................................. H01R 13/00
[52] U.S. Cl. ..................................................... 439/326
[58] Field of Search ......................... 439/296, 326–328, 439/629–637

[56] References Cited

U.S. PATENT DOCUMENTS

| | | | |
|---|---|---|---|
| 4,713,013 | 12/1987 | Regnier et al. | 439/326 |
| 4,826,446 | 5/1989 | Juntwait | 439/326 |
| 4,850,892 | 7/1989 | Clayton | 439/326 |
| 4,986,765 | 1/1991 | Korunski et al. | |
| 4,995,825 | 2/1991 | Korunski et al. | |
| 5,013,257 | 5/1991 | Korunski et al. | |

Primary Examiner—Joseph H. McGlynn
Attorney, Agent, or Firm—Charles S. Cohen; Stephen Z. Weiss

[57] ABSTRACT

A SIMM socket with a metal latch for retaining a SIMM therein is provided. The socket includes a housing having a SIMM receiving slot and a plurality of terminals with contact beams extending into the slot. The SIMM is inserted into the slot in a first angular alignment with minimal insertion forces, and is rotated into a second alignment for achieving high quality electrical connection with the contact beams of the respective terminals. A metal latch is provided for releasably retaining the SIMM in the preferred angular alignment within the socket. The latch is stamped and formed from a unitary piece of metallic material and includes a housing engaging portion and a deflectable SIMM engaging portion. The housing includes walls for controlling the types and ranges of deflection that are permitted for the SIMM engaging portion.

14 Claims, 6 Drawing Sheets

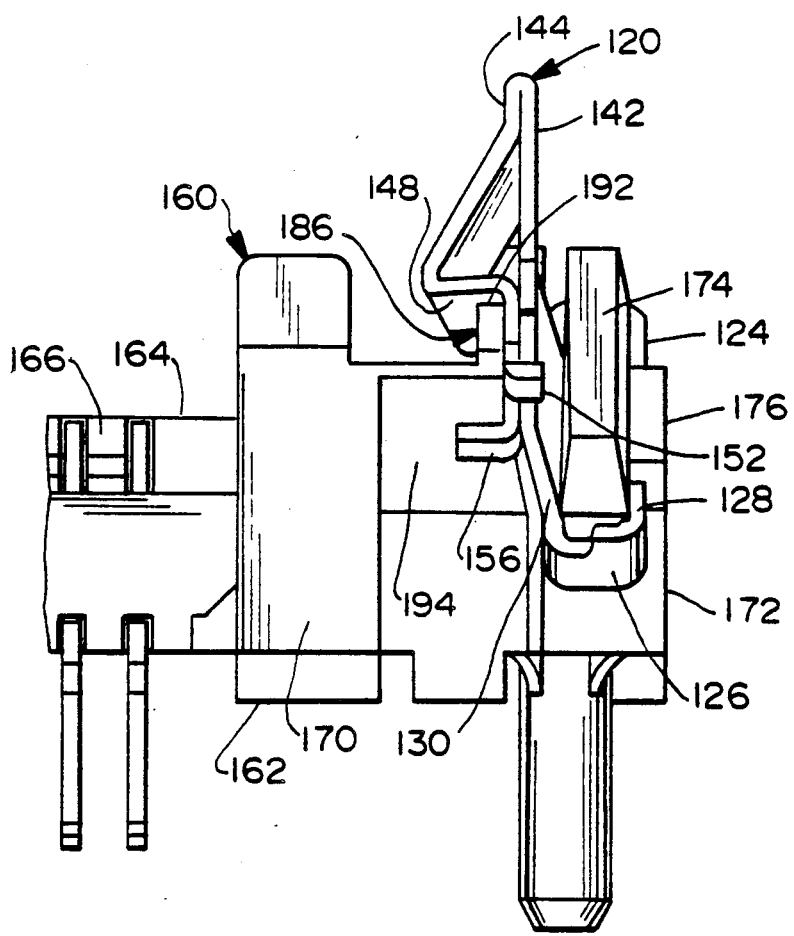
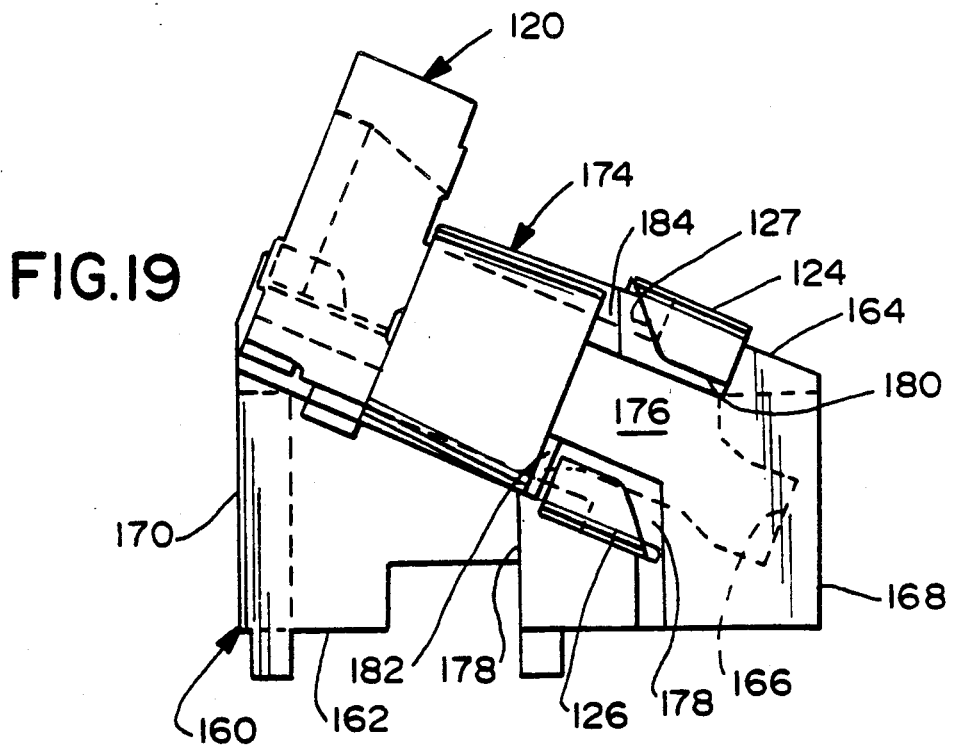

METAL LATCH FOR SIMM SOCKET

CROSS-REFERENCE TO RELATED APPLICATIONS

This application is a continuation of application Ser. No. 629,526, filed Dec. 18, 1990, now abandoned, which was a continuation-in-part of application Ser. No. 553,016, now abandoned, entitled "METAL LATCH FOR SIMM SOCKET" which was filed by Masanori Yagi, et al. on July 16, 1990.

BACKGROUND OF THE INVENTION

Telecommunications equipment, computers and other electrical apparatus comprise arrays of interconnected circuit boards. Each circuit board comprises a rigid planar substrate with a plurality of integrated circuit chips and/or other electronic memory means disposed thereon. This active circuitry on some of the circuit boards is electrically connected to conductive regions along one edge of the planar substrate to enable engagement of these circuit boards with a socket mounted on another circuit board. In this context, the circuit board on which the socket is mounted typically is called the mother board. The board engaged in the socket may be called a daughter board, an edge card, a SIP (single in-line package), a circuit module, a memory module add-on or a SIMM (single in-line memory module). For consistency, the board engageable in the socket will be referred to herein as a SIMM, while the corresponding socket will be referred to as a SIMM socket. This terminology is intended to encompass all such edge connectors and the boards engageable therewith.

The prior art SIMM socket houses a plurality of electrically conductive terminals. Each terminal includes a board mounting portion which is soldered or otherwise connected to circuitry on the board and a mating portion for electrically contacting a specific conductive edge region on the SIMM. A SIMM often is removed and replaced to alter the functions that can be performed by the electrical apparatus in which the SIMM is disposed. Additionally, a SIMM may be removed if any of the many circuits thereon fail or to facilitate trouble-shooting elsewhere in the electrical apparatus.

Prior art SIMM sockets merely relied upon generally linear pushing and pulling of the SIMM into or out of the socket. More particularly, the movement of the edge of the SIMM into the socket would cause contact beams of the terminals in the socket to resiliently deflect and subsequently exert contact forces against the conductive regions along the edge of the SIMM. Although the wiping action achieved during insertion of the SIMM into the prior art socket may be desirable, the insertion forces can damage the fragile terminals. As a result, SIMM sockets and other edge connectors have evolved to eliminate or reduce insertion forces.

Extremely desirable and effective SIMM sockets enable the SIMM to be inserted at a first angle with minimal insertion forces, and subsequently permit the SIMM to be rotated into a second angle for achieving high quality electrical connection with the resilient contact beams of the terminals. These more recent prior art SIMM sockets include latch means for lockingly but releasably retaining the SIMM in an alignment corresponding to a high quality electrical connection with the terminals in the socket. Desirable SIMM sockets of this general type are shown in U.S. Pat. No. 4,575,172 which issued to Walse et al. on Mar. 11, 1986 and U.S. Pat. No. 4,713,013 which issued to Regnier et al. on Dec. 15, 1987. The two above identified patents are assigned to the assignee of the subject invention, and the disclosures thereof are incorporated herein by reference.

It will be noted that in each of the patents identified above, the SIMM socket is defined by a plastic housing having terminals mounted therein. The housing is unitarily molded with plastic mounting pegs which are receivable in mounting apertures of the circuit board for lockingly retaining the SIMM socket thereto. The typical pegs are disposed to define pairs of deflectable legs that initially deflect upon insertion through a hole in the circuit board, and which then resiliently return to an undeflected condition for retaining the socket on the board.

It will also be noted that the SIMM sockets shown in the above identified patents are unitarily molded to include deflectable plastic latches having ramped forward faces that are engaged by the SIMM as the SIMM is rotated into its fully seated alignment. The ramping forces developed between the SIMM and the forward face of each latch urges the latches away from one another and permits continued rotation of the SIMM. Upon full seating of the SIMM, the plastic latches resiliently return to an undeflected alignment for retaining the SIMM in the socket. The plastic latches of the prior art SIMM socket are intended to be manually rotated away from one another to enable removal of the SIMM.

The above described SIMM sockets have received exceptional commercial success in view of the proliferation of computers, advanced telecommunication equipment and other electrical apparatus requiring memory circuitry. However, it has been found that as SIMM sockets have experienced wider use, they have been used by people who are less familiar with the intended operation of the socket. In particular, technicians, computer users and the like were found to grossly overdeflect the SIMM socket latches to effect removal of the SIMM, thereby snapping the latches off at their base. In response to this problem virtually all SIMM socket manufacturers incorporated separate overstress prevention walls to limit the distance by which the SIMM socket latches can be rotated away from one another. Overstress prevention walls are shown, for example, in U.S. Pat. No. 4,832,617 which issued to Brown on May 23, 1989, U.S. Pat. No. 4,850,891 which issued to Walkup et al. on July 25, 1989 and U.S. Pat. No. 4,826,446 which issued to Juntwait on May 2, 1989.

The combination of deflectable plastic latches and overstress walls on SIMM sockets has not eliminated problems associated with the use of SIMM sockets. In particular, users are known to attempt removal of a SIMM by merely rotating the SIMM against the latches thereby exerting forces on both the SIMM and the latches that neither structure was intended to encounter. These rotational forces can damage the circuitry on the SIMM and can snap the latches. Other users attempt to manually rotate the latches in directions other than away from one another. These manual forces on the latches generally will not damage the SIMM but may break the latches. Still other users employ screwdrivers to apply even higher levels of improper force. Attempts to design plastic SIMM latches that avoid breakage have resulted in either latches that are too difficult to deflect, latches that do not adequately retain the SIMM in the socket or latches that may fail after too few cycles of insertion and removal.

In addition to the problems associated with latch breakage, SIMM sockets have experienced breakage of the plastic mounting means for securing the socket to the circuit board. In particular, the mounting pegs must be sufficiently flexible to easily deflect during mounting onto a circuit board, while also being sufficiently strong to retain the SIMM socket in position. Any movement of the SIMM socket relative to the circuit board can cause failure of the soldered electrical connections between the terminals in the socket and the conductive regions on the circuit board. The plastic mounting pegs have been known to break during shipping or initial installation attempts. As a result, the sockets are either rejected or are mounted with a broken mounting peg that can not adequately hold the socket to the board.

A SIMM may assume any of several different thicknesses and may be made from materials having different strength characteristics. These variations in SIMM characteristics may require different latch specifications for the SIMM socket. In particular, the relative distance between the rear wall of the SIMM socket and the locking face of the latch must vary in accordance with the thickness of the SIMM. Additionally, the flexibility of the latch may have to vary in accordance with the relative strength characteristics of the SIMM. All plastic SIMM sockets can be retooled to achieve these various design requirements. However, retooling of this type is expensive and time consuming.

The above identified copending application Ser. No. 553,016 overcomes most of the deficiencies of the prior art. However, it is desirable to provide still further improvements. For example, it is considered desirable to more positively control the deflection of the latches such that the latches deflect about parallel axes which extend substantially orthogonal to the SIMM receiving slot in the socket. Positive prevention of deflection of the latches about axes extending parallel to the SIMM receiving slot should be avoided. Similarly, twisting of each latch also should be prevented. In other embodiments it may be desirable to provide greater retention of the latch on the SIMM socket, while in still other environments it may be desirable to further reinforce the overstress wall of the SIMM socket. Additionally, it may be desirable to provide a latch with a SIMM engaging face that is less likely to be damaged by improperly exerted forces thereon.

In view of the above, it is an object of the subject invention to provide a SIMM socket having a latch means that substantially prevents breakage.

A further object of the subject invention is to provide SIMM socket latches that are easily deflectable, that provide positive locking and that avoid breakage.

It is an additional object of the subject invention to provide SIMM socket latch means that can accommodate boards of different dimensions and strength characteristics without complete retooling of the socket.

Another object of the subject invention is to provide a SIMM socket having latch means that positively resists damage from improperly applied forces thereon.

A further object of the subject invention is to provide a SIMM socket latch that readily permits variations to the moment arm thereof.

Yet another object of the subject invention is to provide a SIMM socket latch that resists twisting along its length without substantially increasing forces required to achieve deflection.

Still a further object of the subject invention is to provide a SIMM socket latch that is positively limited to deflection about a single axis.

A further object of the subject invention is to provide a SIMM socket with a reinforced overstress prevention wall.

SUMMARY OF THE INVENTION

The subject invention is directed to a metal latch for a socket, and to a socket having such a latch securely mounted thereto. The socket of the subject invention includes an elongated nonconductive housing having opposed longitudinal ends, longitudinally aligned front and rear walls extending between the ends, a longitudinally aligned board engaging face and an opposed longitudinally aligned mating face. The mating face defines a longitudinally extending slot for receiving an edge of a SIMM or other such circuit board having conductive regions along an edge.

The subject SIMM socket further comprises a plurality of electrically conductive terminals. Each terminal preferably includes a pair of contact beams disposed respectively on opposite sides of the slot in the SIMM socket housing. The contact beams are configured to accept the edge of the SIMM at a first alignment with minimal insertion force, and to permit rotation of the SIMM into a second alignment at which the contact beams of the socket electrically contact the discrete conductive edge regions of the SIMM. Each terminal further includes means for lockingly retaining the terminal in the housing and board connection means such as a solder tail disposed to extend through a corresponding hole in the circuit board for electrical connection to discrete circuit means printed or otherwise disposed on the circuit board. Particularly effective terminals for SIMM sockets are shown in the above referenced U.S. Pat. No. 4,575,172.

The SIMM socket further comprises means at each opposed end thereof for accurately positioning and selectively retaining the SIMM in its fully inserted alignment. The retaining means at each end of the SIMM socket preferably comprises a rigid rear wall for defining a limit to the rotation of the SIMM corresponding to an alignment for optimum contact between the SIMM and the terminals of the socket. The rear wall may be substantially orthogonal to the plane of the circuit board. Alternatively, low profile SIMM sockets may include a rear wall disposed at an acute angle to the plane of the circuit board, such as an angle of approximately 20°–25°. Each rear wall of the SIMM socket may further include a forwardly extending projection for engaging a correspondingly dimensioned aperture in the SIMM. The projection of the rear wall serves to position the SIMM longitudinally within the slot of the socket to ensure accurate alignment of the terminals with the associated contact regions along the edge of the SIMM. The projections also function to prevent the SIMM from being improperly pulled out of the slot in the socket or unintentionally vibrated free of the slot.

The SIMM socket further comprises metal latches for retaining the SIMM in the fully inserted alignment adjacent the rear walls of the socket. Preferably each SIMM socket comprises a pair of latches mounted respectively in proximity to the ends of the SIMM socket housing. Each latch may be stamped and formed from a unitary piece of resilient metallic material. The latch may comprise housing engagement means for lockingly retaining the latch to corresponding structure on the housing. In particular, each end of the SIMM socket housing may include latch mounting means unitary therewith and constructed for locking engagement of the latch.

Each latch may further include a selectively deflectable SIMM engaging means for securely but releasably engaging the SIMM in an alignment corresponding to full insertion. The SIMM engaging means may define a selectively deflectable latch arm having: a rearwardly facing locking surface; a forwardly facing ramped surface for facilitating the automatic deflection thereof in response to forces exerted by the SIMM during insertion; and a laterally facing actuating surface to enable deflection of the latch for removing the SIMM from the socket. The latch arm may be disposed in sliding contact with one or more surfaces of the SIMM socket to ensure precise movement of the latch arm in response to insertion forces of the SIMM against the forwardly facing ramped surface. In a preferred embodiment, as explained further below, the latch arm may be provided with a pair of spaced apart surfaces disposed in sliding engagement with corresponding surfaces on the SIMM socket. These slidably engageable surfaces of the SIMM socket and the latch may be aligned orthogonal to the preferred axis of deflection of the latch. Thus, deflection of the latch about the preferred axis is assured by the slidable engagement of the latch with the corresponding surfaces on the SIMM socket.

Twisting of the latch along its length can be prevented by increasing the width of the latch. However, a wider latch may be more difficult to deflect, thereby requiring greater and potentially damaging forces to be exerted on and by the SIMM against the ramped face of the latch during insertion of the SIMM into the SIMM socket. The forces required to deflect the latch can be maintained at acceptably low levels by defining a longitudinally extending slot in the latch arm. Thus, the wider latch arm prevents twisting, but the slot reduces the amount of metal in the latch arm and thereby facilitates deflection. In this regard, the latch arm is effectively defined by two parallel arms extending from the housing engagement means of the latch to the SIMM engaging means thereof.

Preferably the latch arm is resiliently deflected during mounting of the latch to the SIMM socket housing, such that the latch arm is preloaded against the housing. The preloaded condition of the latch arm helps to ensure accurate positioning of the latch arm and predictable performance in response to forces exerted thereon during either insertion or removal of the SIMM.

The housing of the SIMM socket may comprise means for preventing overdeflection of the latch that could permanently deform the metal latch. The means for preventing overdeflection may define walls disposed substantially at the extreme longitudinal ends of the SIMM socket to define limits to the amount of deflection enabled for the metal latches. The overdeflection prevention wall of the SIMM socket may be reinforced by a portion of the latch itself. More particularly, the housing engagement means of the latch may be engageable with the overstress prevention wall for reinforcing the overstress prevention wall.

The latch and associated SIMM socket of the subject invention provides several significant advantages. In particular, the latch is substantially unbreakable yet provides desireable deflection characteristics to facilitate both insertion and removal of the SIMM. The available ranges of movement of the latch also can be positively controlled by guide wall structures unitarily molded with the SIMM socket housing. The metal of the subject latch also provides clear visual indication of the latch, thereby reducing the probability that a user will attempt to improperly force the SIMM out of the socket without first actuating the latch.

The provision of a separate metal latch also creates the option for employing a common SIMM socket housing with different latch configurations depending upon the dimensions and characteristics of the SIMM being employed.

BRIEF DESCRIPTION OF THE DRAWINGS

FIG. 18 is a rear elevational view of the SIMM socket shown in FIG. 17.

FIG. 19 is an end elevational view of the SIMM socket shown in FIGS. 17 and 18.

DETAILED DESCRIPTION OF THE PREFERRED EMBODIMENTS

Figure 1:
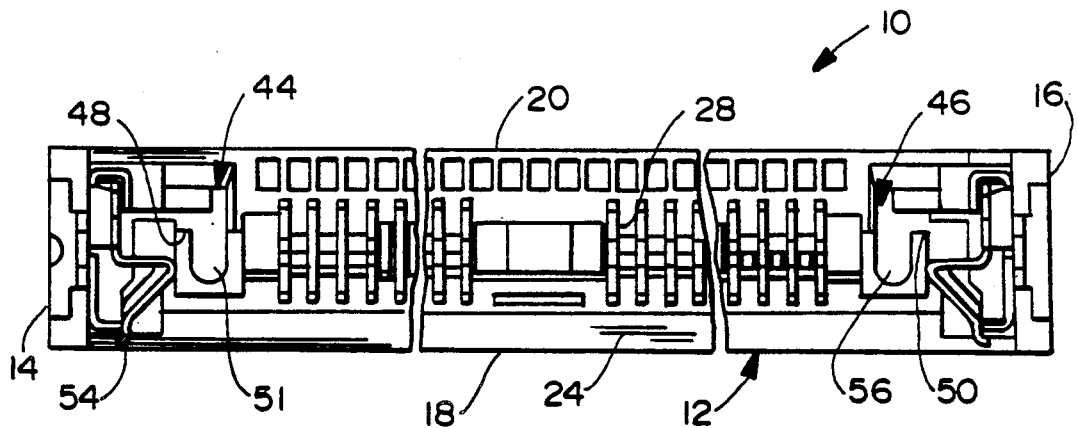
FIG. 1 is a top plan view of a SIMM socket in accordance with the subject invention.
Figure 2:
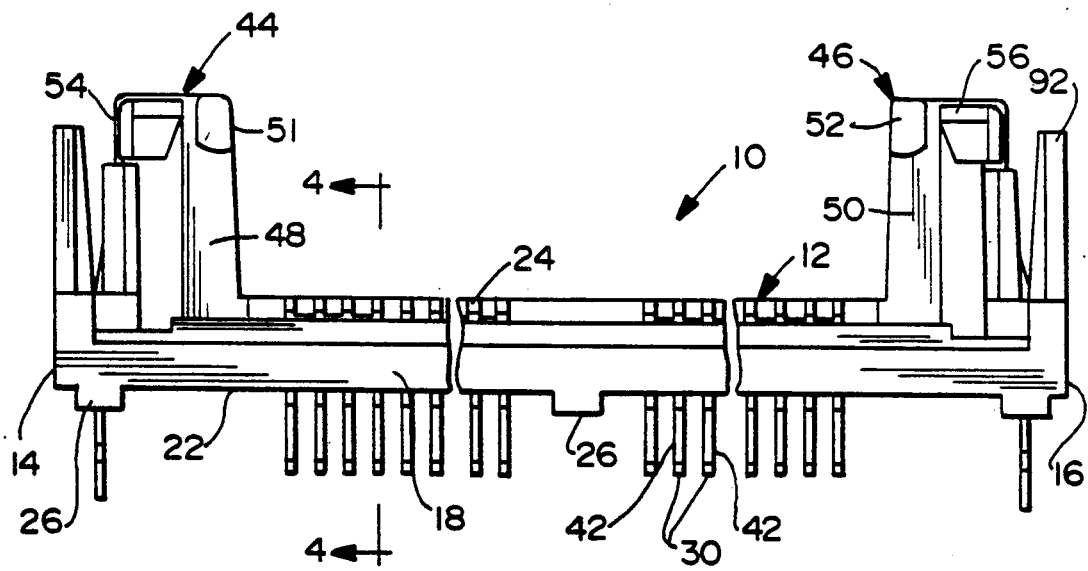
FIG. 2 is a front elevational view of the SIMM socket of the subject invention.
Figure 3:
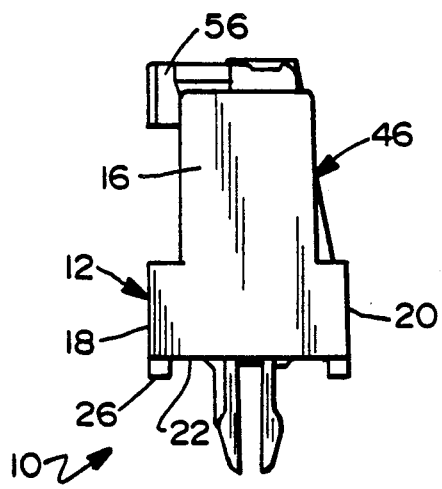
FIG. 3 is an end elevational view taken from the right side of FIG. 2.

The SIMM socket in accordance with the subject invention is identified generally by the numeral 10 in FIGS. 1-4. The SIMM socket 10 includes a unitarily molded plastic housing 12 of elongated generally rectangular configuration. The housing 12 includes opposed longitudinal ends 14 and 16, a front face 18, an opposed rear face 20, a bottom 22 and a top 24. The bottom 22 defines the portion of the SIMM socket housing 12 that will be mounted adjacent the circuit board. The bottom 22 is characterized by stand-offs 26 to facilitate soldering, washing of flux, and/or the application of conformal coatings. The top 24 of the SIMM socket housing 12 includes a longitudinally extending slot 28 into which the edge of the SIMM is insertable. It will be understood that the terms top and bottom as used herein are provided for reference and are not intended to suggest a required gravitational orientation of the SIMM socket 10.

Figure 4:
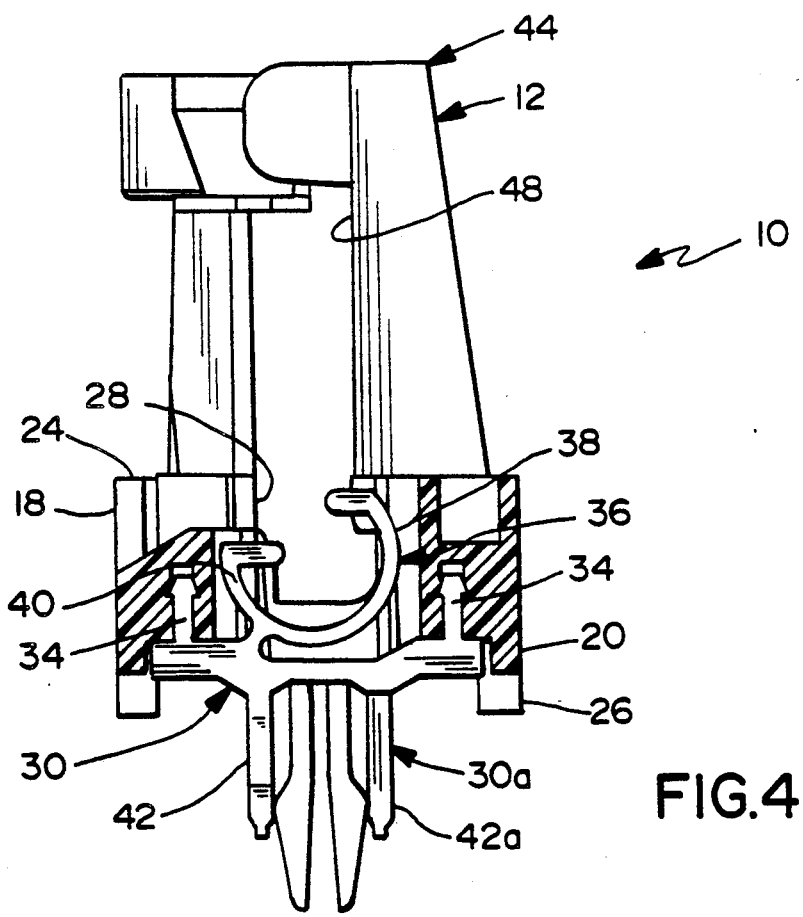
FIG. 4 is a cross-sectional view taken along line 4—4 in FIG. 2.
Figure 5:
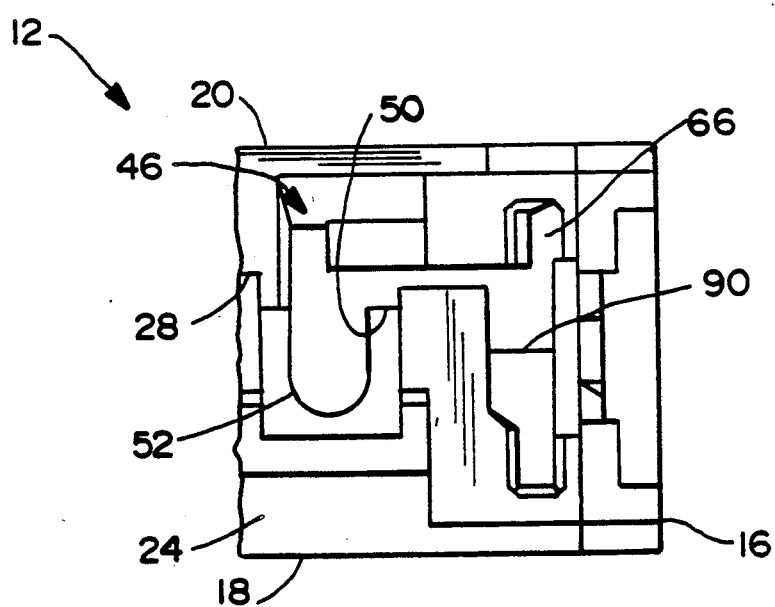
FIG. 5 is a top plan view of a portion of the SIMM socket housing prior to mounting the latch therein.

The SIMM socket 10 further includes a plurality of terminals 30 engaged in the housing 12 at substantially equally spaced locations along the length thereof. As shown more clearly in FIG. 4, each terminal 30 includes a base 32 having mounting means 34 for securely retaining the terminal 30 in the housing 12. The terminal 30 further includes a generally C-shaped contact structure 36 defining contact beams 38 and 40 disposed generally on opposite sides of the SIMM receiving slot 28 in the housing 12. The contact beams 38 and 40 are of different respective lengths to facilitate insertion of the SIMM at a first alignment with minimal insertion forces, and to permit subsequent rotation of the SIMM into a second alignment in which the contact beams 38 and 40 exert high normal contact forces against the discrete conductive regions along the edge of the SIMM. The terminal 30 further includes a solder tail 42 extending from the side of the base 32 opposite the C-shaped contact structure 36. The solder tail 42 extends from the bottom 22 of the SIMM socket housing 12 for further extension through a hole in the circuit board (not shown). With reference to FIG. 4, a solder tail 42a of an adjacent terminal 30a is offset or staggered to avoid the excessive weakening of the circuit board that would result from a single linear array of holes therethrough. A more detailed discussion of a SIMM socket terminal is provided in U.S. Pat. No. 4,575,172.

The SIMM socket housing 12 further includes rear walls 44 and 46 disposed respectively adjacent the opposed longitudinal ends 14 and 16 of the housing 12. The rear walls 44 and 46 of the SIMM socket 12 depicted in FIGS. 1-4 are aligned to extend substantially orthogonally from the circuit board (not shown) to which the SIMM socket 10 is mounted. However, in other embodiments a low profile SIMM socket may be provided with a rear wall aligned at an acute angle to the circuit board. As shown most clearly in FIG. 4, the rear walls 44, 46 broaden to a major dimension at locations closer to the circuit board to render the rear walls 44, 46 substantially rigid and inflexible in response to forces exerted as the SIMM is urged into the socket 10. The rear walls 44, 46 further include a mating face 48, 50 against which the SIMM is seatable in its fully inserted alignment. Additionally, the rear walls 44 and 46 are further characterized by forwardly extending projections 51 and 52 respectively for engaging correspondingly dimensioned apertures in the SIMM to both accurately position the SIMM relatively to the terminals 30 and to prevent improper or unintended withdrawal of the SIMM.

The SIMM socket 10 further includes metal latches 54 and 56 adjacent the opposed ends 14 and 16 respectively. Each latch 54, 56 is stamped and formed from a unitary piece of metallic material. The metal latch 56 is illustrated in greater detail in FIGS. 6-9. More particularly, the latch 56 includes a housing engaging portion 58 defined by a pair of opposed generally U-shaped arms 60 and 62 and a locking tang 64. The arms 60 and 62 are dimensioned to be telescoped over a tapered support post 66 unitarily molded with the housing 12 adjacent the end 16 thereof. The tapered configuration of the support post 66 facilitates mounting the latch 56 to the housing 12. The tang 64 is dimensioned to engage an opposed surface of the housing 12 adjacent the end 16 thereof to prevent the latch 56 from sliding free of the housing 12. Thus, the metal latch 56 is frictionally retained and positively positioned by the arms 60 and 62 thereof, with the tang 64 providing redundant locking retention of the latch 56 to the housing 12.

The metal latch 56 further provides board engaging means, which in this embodiment defines a pair of resiliently deflectable board engaging arms 67 and 68 which pass through an aperture 70 in the housing 12. The arms 67 and 68 include lower ramped surfaces 69 and 71 respectively which generate an inward collapsing of the arms 67 and 68 in response to forces exerted as the arms 67 and 68 are urged into an appropriately dimensioned mounting aperture on the circuit board. The arms 67 and 68 further include locking surfaces 72 and 74 respectively for engaging the surface of the circuit board opposite the surface thereof on which the housing 12 is positioned. The length of each arm 67 and 68 is determined by the thickness of the circuit board. With this construction, the housing engaging portion 58 of the metal latch 56 is operative to securely engage the latch to the housing 12, while the board engaging arms 67 and 68 are operative to securely retain both the latch 56 and the entire housing 12 to the circuit board and may form a more permanent electrical connection to a ground circuit with the application of solder between the board and engaging arms 67 and 68. This redundant mounting construction more positively ensures the preferred alignment of the latch 56 to the SIMM. Furthermore, as noted above, the metal board engaging arms 67 and 68 are not subject to breakage during shipment, handling or mounting to a circuit board, as had occurred with prior art circuits relying entirely upon plastic mounting means.

The metal latch 56 further comprises a resiliently deflectable SIMM engaging latch arm 76 which is cantilevered upwardly from the housing engaging portion 58. A notch 77 at the interface of the SIMM engaging latch arm 76 and the housing engaging portion 58 defines a depth selected in accordance with the preferred resiliency for the arm 76. The latch arm 76 is defined by a stop wall 78 for engaging a corresponding stop wall 80 unitarily molded with the housing 12 to limit and positively define the range of movement of the SIMM engaging latch arm 76 toward the SIMM. Thus, the SIMM engaging latch arm 76 will not exert unintended forces on side edges of the SIMM. The latch arm 76 further includes a SIMM engaging locking wall 82 for engaging a planar surface of the SIMM opposite the rear wall 46 of the housing 12. The SIMM engaging wall 82 and the stop wall 78 of the latch arm 76 are substantially orthogonally aligned to one another. Additionally, the SIMM engaging wall 82 is aligned to be substantially parallel and in face-to-face relationship with a SIMM mounted in the socket 10.

The latch arm 76 is further characterized by an inclined camming wall 84 which is aligned to the SIMM engaging wall 82 at an angle "a" of approximately 45°. As the SIMM is rotated into its inserted alignment, the rear face of the SIMM will engage the cam surface 84 of the latch arm 76 to generate ramping forces for urging the beam 76 outwardly as indicated by arrow "b" in FIG. 6 for permitting full insertion of the SIMM. The movement of the SIMM in the direction indicated by arrow "b" is guided by slidable movement of the SIMM engaging wall 82 along the front face 86 of the stop wall 80 on the housing 12.

Figure 9:
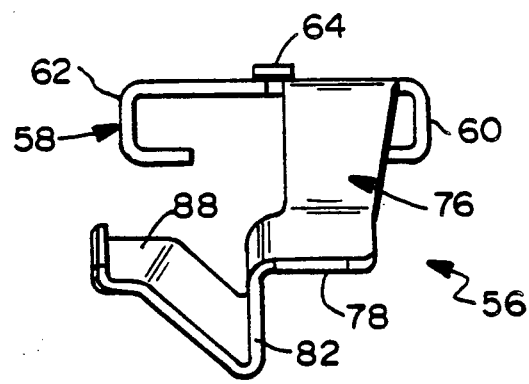
FIG. 9 is a top plan view of the latch shown in FIGS. 7 and 8.
Figure 8:
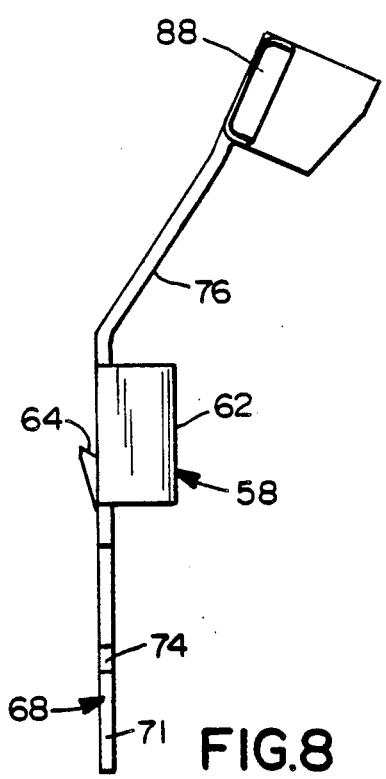
FIG. 8 is a front elevational view of the latch shown in FIG. 7.
Figure 7:
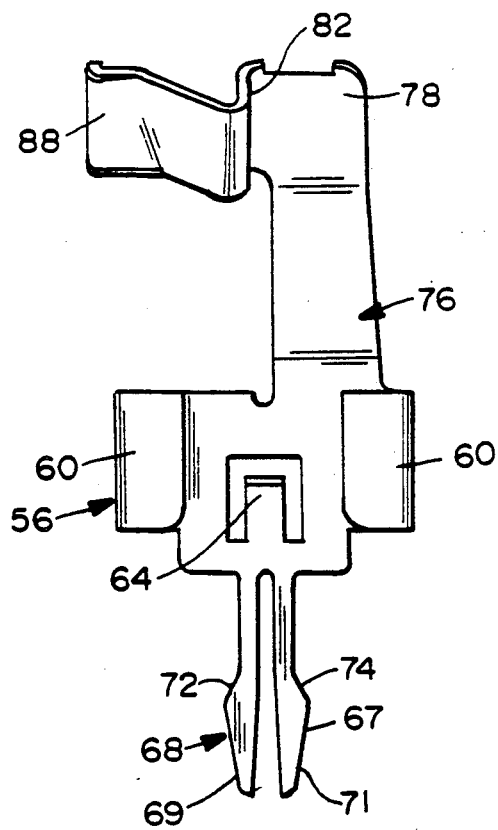
FIG. 7 is a side elevational view of the SIMM socket latch shown, in FIG. 6.
Figure 11:
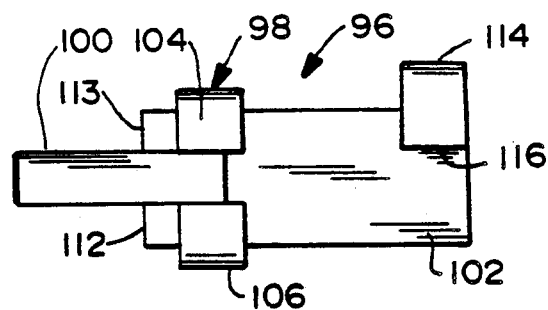
FIG. 11 is a side elevational view of the alternate latch shown in FIG. 10.
Figure 13:
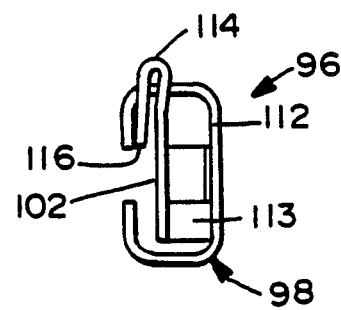
FIG. 13 is a top plan view of the latch shown in FIGS. 11 and 12.
Figure 12:
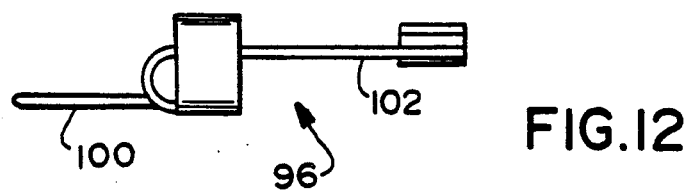
FIG. 12 is a front elevational view of the latch shown in FIG. 11.

The SIMM engaging latch arm 76 terminates at actuator 88 which extends generally parallel to the stop wall 78 of the latch arm 76. The actuator 88 is dimensioned to facilitate engagement by the thumb or forefinger of a user to urge the SIMM engaging latch arm 76 in the direction indicated by arrow "b" to facilitate the intentional release and removal of the SIMM from the socket 10. The metal latch 56 as illustrated in FIGS. 7-9 is formed to require an initial biasing during mounting into the housing 12 to preload the latch arm 76 and to thereby achieve normal preload forces between the stop wall 78 of the metal latch 56 and the corresponding stop wall 80 of the housing 12. This preload is achieved by movement of the SIMM engaging latch arm 76 through approximately 20° to ensure accurate positioning of the SIMM engaging wall 82 after repeated uses of the metal latch 56.

Movement of the SIMM engaging latch arm 76 in a direction other than that indicated by arrow "b" is prevented by both the forward face 86 of the stop wall 80 on the housing 12 and by a positioning wall 90. More particularly, the positioning wall 90 is unitarily formed as part of the rigid support post 66 and is beneath the actuator 88 and forward of the SIMM engaging latch arm 76. The positioning wall 90 prevents a forward rotation of the SIMM engaging latch arm 76 that could occur in response to improperly applied forces.

To prevent overdeflection of the SIMM engaging latch arm 76 in direction "b", the housing 12 further is provided with an overdeflection prevention wall 92 disposed rigidly at the ends 14, 16 of the housing 12. The over-deflection prevention wall 92 is disposed and aligned to permit sufficient deflection of the SIMM engaging latch arm 76 to permit insertion or removal of the SIMM, but to contact the SIMM engaging latch arm 76 for preventing excessive and potentially damaging rotation thereof.

The metal latch 56 is mounted to the housing 12 by merely urging the board engaging arms 67 and 68 through the aperture 70 in the housing 12, and by simultaneously urging the U-shaped arms 60 and 62 over the tapered support post 66 of the housing 12. The frictional forces between the U-shaped arms 60 and 62 and the support post 60 gradually increase as the latch 56 is urged downwardly onto the housing in view of the tapered configuration of the support post 66. Additional positive locking engagement of the latch 56 to the housing 12 is achieved by the tang 64. In this fully seated position, as illustrated most clearly in FIGS. 3 and 4, the deflectable board engaging arms 67 and 68 extend from the bottom face 22 of the housing 12. The entire socket 10 then can be mounted to a circuit board by merely urging the board engaging arms 67 and 68 into a correspondingly dimensioned mounting aperture in the circuit board. Movement of the SIMM engaging beam 76 is accurately controlled by the unitarily molded plastic structure at the ends 14 and 16 of the housing 12. In particular, inward movement of the SIMM engaging latch arm 76 toward the opposed end of the socket 10 is prevented by the stop wall 80. Rearward movement of the SIMM engaging latch arm 76 is prevented by direct contact between the SIMM engaging wall 82 of the latch arm 76 and the front face 86 of the stop wall 80. Forward deflection of the SIMM engaging latch arm 76 is prevented by the positioning wall 90 of the support post 66. Finally, the necessary deflection of the SIMM engaging beam 76 in direction "b" is carefully controlled by the overdeflection prevention wall 92.

An alternate embodiment of the metal latch is identified generally by the numeral 96 in FIGS. 10-13. The metal latch 96 also is stamped and formed from a unitary piece of metallic material and comprises a housing engaging portion 98, a board engaging portion 100 and a SIMM engaging portion 102 which defines a deflectable latch arm. The housing engaging portion 98 of the metal latch 96 comprises a pair of U-shaped arms 104 and 106 which are frictionally retained in an aperture 108 in a SIMM socket housing 110.

The SIMM engaging latch arm 102 of the latch 96 has a bifurcated base which extends from lower root portions 112 and 113 of the housing engaging portion 98 upwardly through the generally rectangular structure defined by the opposed U-shaped arms 104 and 106. Portions of the SIMM engaging latch arm 102 remote from the roots 112, 113 are formed to define an actuator 114 which is dimensioned to be actuated by a thumb or forefinger of a user of the subject SIMM socket. The arcuate formed configuration of the actuator 14 will generate deflection of the SIMM engaging latch arm 102 in direction "c" in response to forces exerted on the actuator 114 as the SIMM is rotated into its fully seated position. Additionally, the actuator 114 is dimensioned to facilitate actuation by a thumb or forefinger of a user of the SIMM socket. The edge 116 defines a SIMM engaging portion of the latch arm 102 securely retains the SIMM in its fully seated alignment against the rear wall 118 of the housing 110.

The board engaging portion 100 of the metal latch 96 is stamped to extend from a portion of the metal material that otherwise would have been disposed in the SIMM engaging latch arm 102. In contrast to the previous embodiment, the board engaging portion 100 merely defines a single board engaging tail that may be deflected or soldered into secure locking engagement with the board to which the housing 110 is mounted. The metal latch 96 is mounted to the housing 110 substantially in the same manner as the metal latch 56 described and illustrated in the previous embodiment. Additionally, the metal latch 96 performs in substantially the same manner. In particular, the metal latch 96 permits secure mounting to both the board and the housing 110. Deflection of the SIMM engaging latch arm 76 in unintended directions can be prevented by the housing structure described with respect to the previous embodiment. Alternatively, forward and rearward deflection of the SIMM engaging latch arm 102 is substantially prevented by the bifurcated base 112, 113 from which the SIMM engaging beam 102 extends. Excessive deflection of the beam toward the SIMM can be prevented by the rear wall 118. The resiliency of the SIMM engaging latch arm 102 can readily be controlled by altering the width of the stamped board engaging portion 100, and thereby altering the width of the notch between the bifurcated roots 112 and 113. Similarly, the metal latch 96 can be formed to accommodate any circuit board thickness by altering the length of the board engaging portion 100 and can accept any SIMM thickness by altering the formed configuration of the actuator 114.

Figure 14:
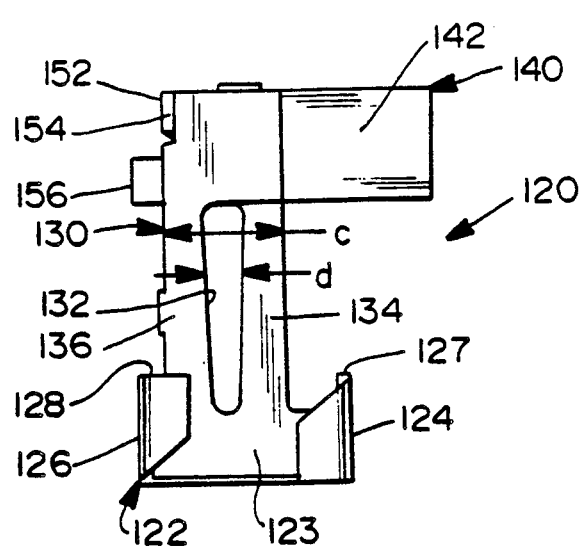
FIG. 14 is a side elevational view of a third embodiment of a SIMM, socket latch.
Figure 15:
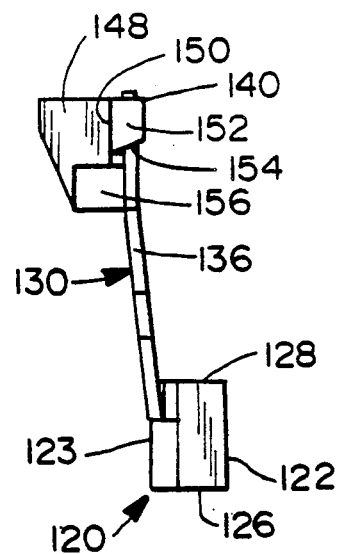
FIG. 15 is a rear elevational view of the latch shown in FIG. 14.
Figure 16:
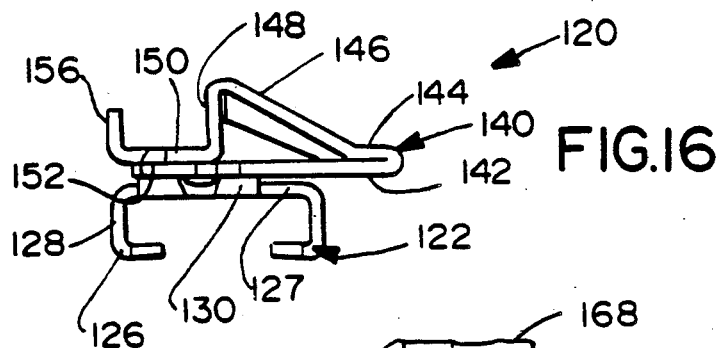
FIG. 16 is a top plan view of the latch shown in FIGS. 14 and 15.

A third embodiment of the metal latch is identified generally by the numeral 120 in FIGS. 14-16. As in the previously described embodiments, the metal latch 120 is stamped and formed from a unitary piece of resilient metal. The latch 120 is stamped and formed to comprise a housing engaging portion 122 which defines one longitudinal end of the latch 120. The housing engaging portion 122 comprises a planar central root 123 from which front and rear generally U-shaped arms 124 and 126 extend. In this context, the terms "front" and "rear" relate to rotation of the SIMM in a rearward direction for mating with the housing as explained below. Portions of the latch arms 124 and 126 opposite the root 123 are spaced from one another, to receive a portion of the housing therebetween, as explained further below.

Unlike the previously described embodiments, the latch 120 is not provided with a stamped and formed tang to engage the housing. Rather, the U-shaped arms 124 and 126 are stamped to define top edges 127 and 128 which will lockingly engage shoulders formed on the SIMM housing as explained further below. It will also be noted, that the latch 120, unlike the latches described in the previous embodiments, does not include separate board mounting means. Rather, the edges 127 and 128 of the latch 120 will be securely and lockingly engaged to the housing and the housing will be independently lockingly mounted to a printed circuit board.

The metal latch 120 further comprises a resiliently deflectable SIMM engaging latch arm 130 of width "c" which is cantilevered from the root 123 of the housing engaging portion 122. A longitudinally extending slot 132 of width "d" extends substantially the entire length of the latch arm 130. Thus, the latch arm 130 effectively defines first and second spaced apart generally parallel beams 134 and 136 respectively each of which is cantilevered from the root 123. The width "d" of the slot 132 is selected in accordance with the specified and/or desired deflection force for the latch arm 130. In particular, a latch arm 130 having a slot 132 of wider dimensions "d" will be easier to deflect than a latch arm 130 having a very narrow slot 132 or a latch arm 130 with no slot 132. Thus, the width dimensions "d" of the slot 132 are selected in accordance with the type of metal from which the latch 120 is formed, the thickness of the metal, the length of the latch arm 130 and various parameters relating to the SIMM, including its dimensions and strength. The two generally parallel spaced apart deflectable beams 134 and 136 comprising the latch arm 130 are effective in resisting longitudinal twisting of the latch arm 130 and in preventing rotation of the latch arm 130 about an axis extending orthogonal to the plane of the metal from which the latch 120 is stamped and formed. Consequently secure retention of a SIMM can be achieved without requiring excessively high deflection forces. Furthermore, the resistance to twisting and other unwanted bending ensures a long life for the latch 120.

With reference to FIG. 15, it will be noted that the latch arm 130 is formed to be in nonplanar alignment with the root 123 of the housing engaging portion 122. Furthermore, the latch arm 130 extends to a side of the planar root direction opposite from the formed configuration of the U-shaped arms 124 and 126. As will be explained further below, this particular configuration of the latch 120 enables the housing engagement portion 122 of the latch 120 to perform a reinforcing function on the overstress prevention wall of the housing, and enables the latch arm 130 to be preloaded against the housing.

The end of the latch 120 remote from the housing engaging portion 122 defines a SIMM engaging portion identified generally by the numeral 140. The SIMM engaging portion 140 includes a generally planar latch support wall 142 which extends unitarily from the latch arm 130 and transversely therefrom in a generally forward direction. An actuator wall 144 extends unitarily from the latch support wall and is formed to lie substantially in face-to-face abutting relationship to the latch support wall 142. The actuator wall 144 is dimensioned to be readily engaged by a thumb or forefinger to deflect the latch arm 130 for removing a SIMM. A camming wall 146 extends unitarily from the actuator wall 144 and is aligned thereto at an acute angle. The camming wall 146 performs a function similar to the camming wall 84 of the first embodiment described above. Forces of the SIMM on the camming wall 146 will generate deflection of the latch arm 130 and the SIMM engaging portion 140 extending therefrom.

A SIMM engaging wall 148 extends unitarily from the camming wall 146 orthogonally back toward the latch support wall 142. The SIMM engaging wall 148 is disposed and dimensioned to engage the SIMM upon complete rotation of the SIMM into the fully seated alignment in the housing. A stop wall 150 extends unitarily from the SIMM engaging wall 148 and generally orthogonal thereto. More particularly, the stop wall 150 is disposed substantially in face-to-face engagement with the latch support wall 142. The stop wall 150 is generally comparable to the stop wall 78 of the first embodiment, and will be preloaded against a corresponding stop wall on the housing as explained further below. A locking tab 152 extends unitarily from a portion of the stop wall 150 and engages the rear edge 154 of the latch support wall 142. The rear edge 154 defines the portion of the latch support wall 142 opposite the articulation between the latch support wall 142 and the actuator wall 144. The locking tab 152 ensures support for the SIMM engaging wall 148 and the camming wall 146 in response to forces exerted on a fully seated SIMM. More particularly, an improper attempt to remove a SIMM by rotating the SIMM against the SIMM engaging wall 148 will be resisted by the locking tab, thereby ensuring that the SIMM engaging wall 148 and the camming wall 146 do not deform in response to such forces. A guide wall 156 also extends unitarily from the stop wall 150, but in a direction opposite the locking tab 152. The guide wall 156 is parallel to the SIMM engaging wall 148, and is disposed and dimensioned to slidably engage a corresponding guide wall on the SIMM housing, as explained further below, to prevent twisting or unintended deformation of the latch 120.

Figure 17:
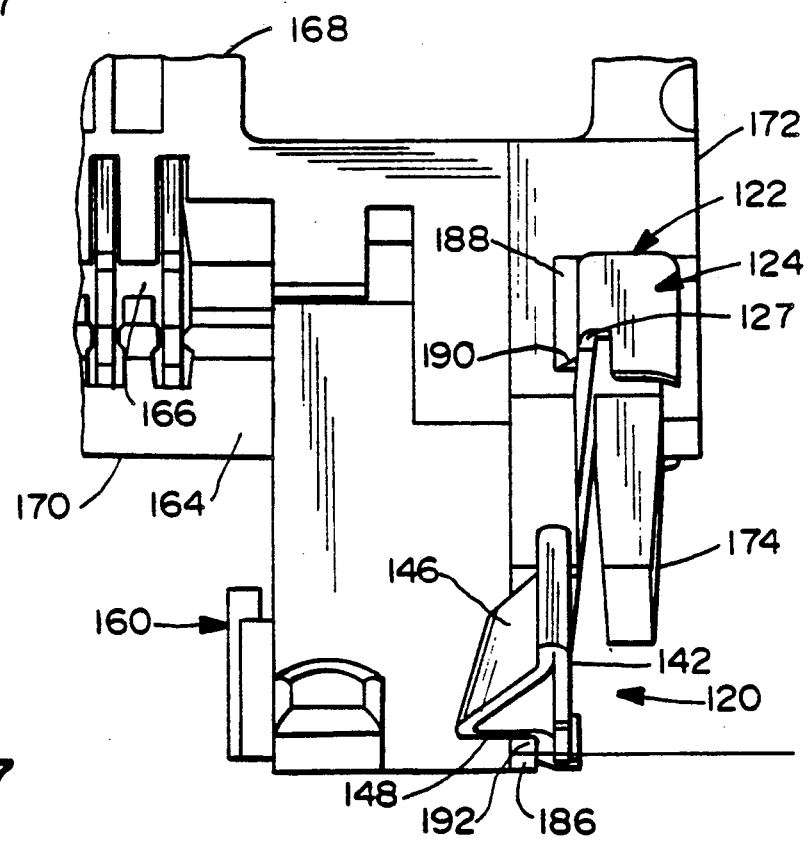
FIG. 17 is a top plan view of a portion of a SIMM socket employing the latch of FIGS. 14-16.

Turning to FIGS. 17-19, the latch 120 is mountable to a SIMM housing 160. More particularly, the housing 160 is an elongated structure similar to the housing 10 described and illustrated above. However, the housing 160 is of low profile construction and is configured such that the SIMM mounted therein will be aligned at an acute angle to the printed circuit board on which the housing 160 is mounted. In particular, the housing 160 includes a bottom face 162 for mounting on a circuit board, an opposed top mating face 164 with a SIMM receiving slot 166 extending therein. A front face 168 and a rear face 170 each extend between the bottom and top faces 162 and 164 respectively. The rear face 170 defines the portion of the SIMM housing 160 toward which the SIMM is rotated during mating in the slot 166 of the housing 160.

The SIMM housing 160 further includes a pair of opposed longitudinal ends, a first of which is illustrated in FIGS. 17-19 and is identified generally by the numeral 172. A mounting post 174 is generally adjacent the first end 172 and extends angularly from the top face 164 generally toward the rear face 170. The mounting post 174 is characterized by an alignment block 176 on the side thereof defining the first end 172 of the housing 160. The alignment block 176 is dimensioned to fit between the spaced apart edges of the U-shaped arms 124 and 126. The alignment block 176 ensures proper polarity and alignment of the latch 120 thereon and prevents the latch 120 from being fully seated in a reversed alignment. The mounting post 174 is further characterized by undercut portions 178 and 180 on opposite respective sides of the alignment block 176. The undercut portions 178 and 180 define shoulders 182 and 184 respectively for engaging the top edges 127 and 128 of the U-shaped arms 124 and 126 upon full seating of the latch 120 on the mounting post 174.

In the fully seated position of the latch 120 on the housing 160, the mounting post 174 is disposed intermediate the latch arm 130 and the end 172 of the housing 160. Thus, the mounting post 174 also functions as an overstress prevention wall by limiting the deflection of the latch arm 130 toward the end 172 of the housing 160. The ability of the mounting post 174 to prevent overstress is enhanced by the U-shaped arms 124 and 126 of the latch 120 which reinforce the mounting post 174 in addition to providing the mounting means for the latch 120.

The housing 160 further comprises a preload post 186 in generally parallel spaced relationship to the mounting post 174. The distance between the mounting post 174 and the preload post 186 is selected to permit the latch arm 130 to be slid therebetween. Additionally, the relative alignment of the latch arm 130 and the dispositions of the mounting post 174 and the preload post 186 are selected such that the latch arm 130 is deflected by and preloaded against the preload post 186. Furthermore, the distance between the mounting post 174 and the preload post 186 is selected to permit sufficient deflection of the latch arm 130 away from the preload post 186 and toward the mounting post 174 to enable rotation of a SIMM into proper alignment in the mating slot 166 of the housing 160. As noted above, the mounting post 174 prevents overdeflection of the latch arm 130.

The preload post 186 is further characterized by an undercut 188 and a shoulder 190 which are disposed to lockingly engage the top edge 127 of the front U-shaped arm 124. Thus, the latch 120 is redundantly locked on the housing 160 by engagement of the top edge 127 with both the shoulders 182 and 190 of the housing 160 and the engagement of the top edge 128 with the shoulder 184.

As shown most clearly in FIG. 18, the SIMM engaging wall 148 of the latch 120 extends away from the first end 172 of the housing 160 and beyond the preload post 186. However, the SIMM engaging wall is disposed to be in sliding engagement with the forwardly and upwardly facing surface 192 of the preload post 186. With further reference to FIG. 18, the guide wall 156 of the latch 120 is disposed in sliding engagement with the downwardly and rearwardly facing surface 194 of the preload post 186. With this construction, the deflection of the latch arm 130 away from the preload post 186 is positively limited to rotation about an axis disposed in the plane of the latch arm 130 and generally orthogonal to the length thereof. In this regard, the sliding engagement of the SIMM engaging wall 148 with the forward face 192 of the preload post 186 prevents the latch arm 130 from deflecting downwardly or rearwardly in response to forces exerted on the cam wall 146 by a SIMM. Similarly, the sliding engagement of the guide wall 156 against the downward rear face 194 of the preload post 186 prevents the latch arm 130 from deflecting upwardly and forwardly in response to forces exerted by an attempt to remove a SIMM without first deflecting the latch arm 130 toward the mounting post 174. Additionally, this sliding engagement of the SIMM engaging wall 148 with the face 192 of the preload post 186 and the sliding engagement of the guide wall 156 with the face 194 of the preload post 186 prevents twisting of the latch arm 130. Twisting is further prevented by the above described slotted construction of the latch arm 130.

While the invention has been described with respect to certain preferred embodiments, it is apparent that various changes can be made without departing from the scope of the invention as defined by the appended claims. For example, the slotted latch arm construction, the reinforced latch, the sliding movement of the latch against the housing and the reinforcement of the overstress prevention post all can be provided independent of one another and on embodiments where the metal latch mounts to the circuit board.

We claim:

1. A socket having a unitarily molded nonconductive housing with an elongated slot formed therein for receiving an edge of a generally planar circuit module, a plurality of electrically conductive terminals mounted in the housing in proximity to the slot such that the module can be inserted into the slot in a first alignment with minimal insertion force and can be rotated into a second alignment for contacting the terminals in the housing, the housing comprising at least one rear wall for defining a limit to the rotation of the module in the socket, a metal latch mounted to said housing at a housing engaging portion of the latch and comprising a deflectable latch arms and a latch portion extending unitarily from an end of the latch arm remote from the housing engaging portion, the latch portion being configured to lockingly engage a circuit module in the second alignment in the housing, wherein the improvement comprises:

said housing comprising at least one mounting post adjacent an end of the slot; and said metal latch having a housing engaging portion securely mounted around the mounting post of the housing.

2. A socket as in claim 1 wherein said housing further comprises a preload post in spaced relationship to said mounting post, said metal latch being located between said mounting post and said preload post and the latch portion of the metal latch comprises a pair of opposed parallel surfaces disposed in sliding engagement with the preload post for controlling deflection of the latch arm and preventing longitudinal twisting thereof.

3. A socket as in claim 1 wherein the mounting post includes an alignment block on a side thereof opposite said slot, the housing engaging portion of the metal latch being configured to engage the alignment block of the mounting post to ensure proper alignment of the metal latch on the mounting post.

4. A socket as in claim 1 wherein the mounting post comprises at least one undercut portion defining a locking shoulder, the housing engaging portion of the metal latch comprising at least one edge disposed and dimensioned to lockingly engage the locking shoulder of the mounting post for securely locking the metal latch to the housing.

5. A socket as in claim 1 wherein the latch arm comprises a pair of spaced apart parallel beams, the dimensions of the beams and the spacing therebetween being selected for preventing twisting of the latch arm and controlling forces required to deflect the latch arm.

6. A socket as in claim 1 wherein the housing engaging portion comprises a pair of opposed U-shaped arms dimensioned for securely engaging the mounting post of the housing.

7. A socket as in claim 6 wherein said U-shaped arms are dimensioned so as to be force fit around said mounting post.

8. A socket as in claim 6 wherein the mounting post includes an alignment block on a side thereof opposite said slot, the housing engaging portion of the metal latch being configured to engage the alignment block of the mounting post to ensure proper alignment of the metal latch on the mounting post.

9. A socket as in claim 6 wherein the mounting post comprises at least one undercut portion defining a locking shoulder, the housing engaging portion of the metal latch comprising at least one edge disposed and dimensioned to lockingly engage the locking shoulder of the mounting post for securely locking the metal latch to the housing.

10. A socket having a unitarily molded nonconductive housing with an elongated slot formed therein for receiving an edge of a generally planar circuit module, a plurality of electrically conductive terminals mounted in the housing in proximity to the slot such that the module can be inserted into the slot in the first alignment with minimal insertion force and can be rotated into a second alignment for contacting the terminals in the housing, the housing comprising at least one rear wall for defining a limit to the rotation of the module in the socket, a metal latch mounted to said housing at a housing engaging portion of said latch and comprising a latch arm deflectably cantilevered from the housing engaging portion, a latch portion on an end of the latch arm remote from the housing engaging portion, wherein the improvement comprises:

said housing comprising at least one preload post adjacent an end of the slot and at least one mounting post in spaced relationship to the preload post, said mounting post comprising an overstress prevention wall; and said metal latch having a housing engaging portion securely mounted around the mounting post, the latch portion comprising a stop wall preloaded against the preload post of the housing, and a module engaging wall extending generally orthogonal to the stop wall and in sliding engagement with the preload post, whereby the preloaded disposition of the stop wall against the preload post and the slidable disposition of the module engaging wall with the preload post ensures accurate alignment and positioning of the latch portion relative to the circuit module.

11. A socket as in claim 10 wherein said metal latch further comprises a guide wall disposed in spaced parallel relationship to the module engaging wall, the guide wall being disposed in sliding engagement with a surface of the preload post, whereby the slidable disposition of the guide wall and the module engaging wall with the preload post substantially prevents twisting of the latch arm and controls deflection thereof.

12. A socket as in claim 10 wherein the housing engaging portion comprises a pair of opposed U-shaped arms dimensioned for securely engaging the mounting post of the housing.

13. A socket as in claim 12 wherein the mounting post includes an alignment block on a side thereof opposite said slot, the housing engaging portion of the metal latch being configured to engage the alignment block of the mounting post to ensure proper alignment of the metal latch on the mounting post.

14. A socket as in claim 12 wherein the mounting post comprises at least one undercut portion defining a locking shoulder, the housing engaging portion of the metal latch comprising at least one edge disposed and dimensioned to lockingly engage the locking the metal latch to the housing.

* * * * *

UNITED STATES PATENT AND TRADEMARK OFFICE
CERTIFICATE OF CORRECTION

Page 1 of 2

PATENT NO. : 5,094,624

DATED : March 10, 1992

INVENTOR(S) : Patrick D. Bakke, et al

Figure 6:
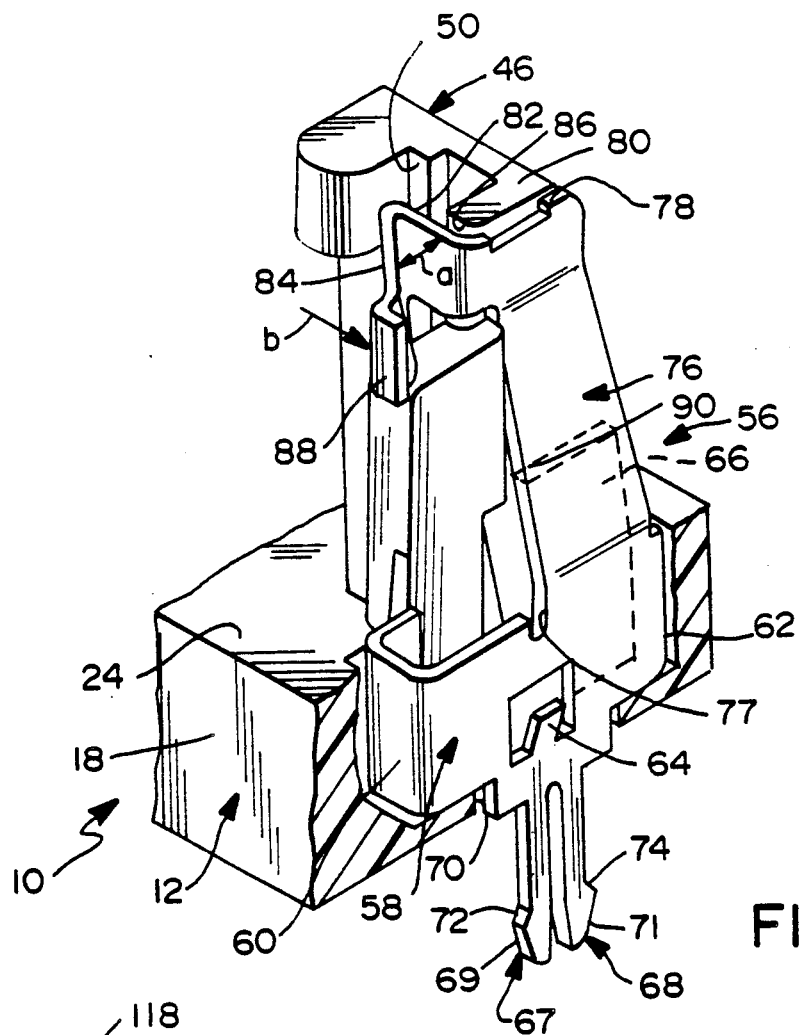
FIG. 6 is a perspective view, partly in section, showing the latch mounted to the SIMM socket housing.
Figure 10:
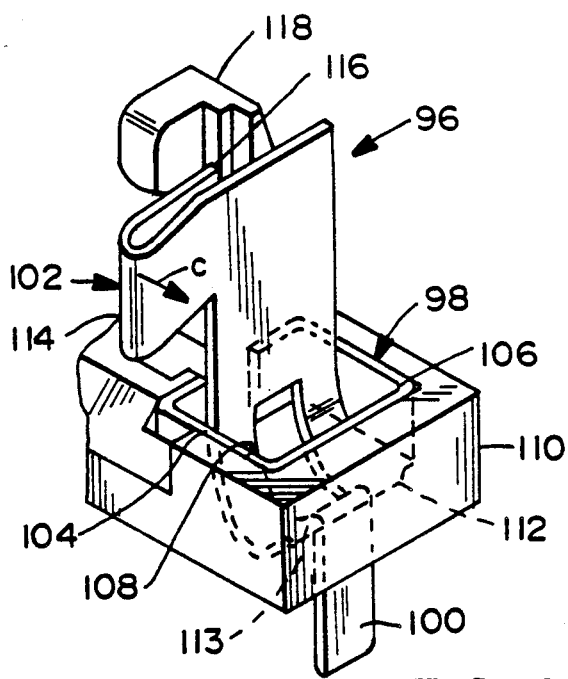
FIG. 10 is a perspective of an alternate SIMM socket latch and housing.

It is certified that error appears in the above-identified patent and that said Letters Patent is hereby corrected as shown below:

The sheet of drawing, consisting of figure 6, should be deleted and replaced with the attached sheet.

Signed and Sealed this

Sixth Day of July, 1993

Attest:

MICHAEL K. KIRK

Attesting Officer

Acting Commissioner of Patents and Trademarks

UNITED STATES PATENT AND TRADEMARK OFFICE
CERTIFICATE OF CORRECTION

PATENT NO. : 5,094,624

DATED : March 10, 1992

INVENTOR(S) : Patrick D. Bakke, et al.

It is certified that error appears in the above-identified patent and that said Letters Patent is hereby corrected as shown below:

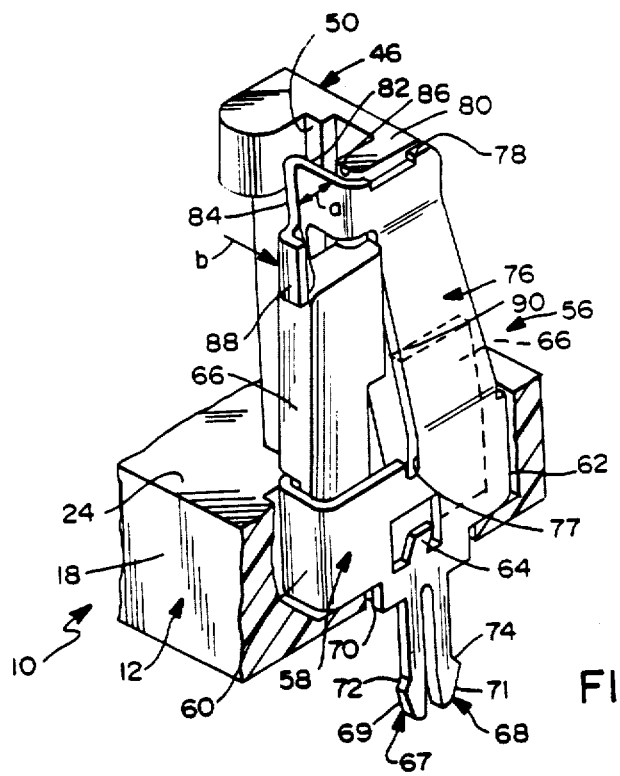

FIG.6